United States Patent [19]

Todorof

[11] Patent Number: 4,479,027
[45] Date of Patent: Oct. 23, 1984

[54] MULTI-LAYER THIN-FILM, FLEXIBLE SILICON ALLOY PHOTOVOLTAIC CELL

[76] Inventor: William J. Todorof, 590 Cress St., Laguna Beach, Calif. 92651

[21] Appl. No.: 422,944

[22] Filed: Sep. 24, 1982

[51] Int. Cl.$^3$ ............................................. H01L 31/06
[52] U.S. Cl. ................................. 136/249; 136/255; 136/256; 136/257; 136/258; 136/259; 136/261; 357/30; 29/572; 252/62.3 R; 252/62.3 BT; 252/501.1
[58] Field of Search ............... 136/256, 257, 259, 255, 136/249 TJ, 258 PC, 258 AM, 261, 245; 357/30; 252/62.3 R, 62.3 BT, 501.1

[56] References Cited

U.S. PATENT DOCUMENTS

| | | | |
|---|---|---|---|
| 3,437,527 | 4/1969 | Webb | 136/256 |
| 3,994,012 | 11/1976 | Warner, Jr. | 136/246 |
| 4,016,586 | 4/1977 | Anderson et al. | 357/2 |
| 4,024,558 | 5/1977 | Merrin | 357/2 |
| 4,133,698 | 1/1979 | Chiang et al. | 136/255 |
| 4,355,196 | 10/1982 | Chai | 136/259 |
| 4,360,701 | 11/1982 | Evans, Jr. | 136/259 |

FOREIGN PATENT DOCUMENTS

| | | | |
|---|---|---|---|
| 2108479 | 9/1971 | Fed. Rep. of Germany | 136/257 |
| 53-60171 | 5/1978 | Japan | 136/256 |
| 55-108780 | 8/1980 | Japan | 136/259 |

OTHER PUBLICATIONS

H. Von Seefeld et al., "Investigation of Titanium Nitride Layers for Solar Cell Contacts", *IEEE Trans. Electron Devices*, vol. Ed-27, pp. 873–876, 1980).
M. Givliano et al., "The Gridded Back Contact & Its Effect On Solar Cell Performance", *Conf. Record, 15th IEEE Photovoltaic Specialists Conf.*, (1981), pp. 111–114.

Primary Examiner—Aaron Weisstuch

[57] ABSTRACT

The flexible photovoltaic cell includes thin front and rear junction regions electrically in series each formed of ceramic metallic glass semi-conductor alloys of silicon of approximately zero thermal expansion/contraction coefficient laminated with an intervening semi-conducting layer less than 60 Angstroms thick or an insulating layer less than 20 Angstroms thick. The respective spectral sensitivities of front and rear junction regions are tailored to different frequency ranges. In front are six layers described in sequence rear to front. The lowermost (sixth) is a green/blue semi-insulating cobalt and tin passivating and filter layer less than 10 Angstroms thick. The fifth is a semi-conductive, degradation-protective "window" and one-way mirror for returning back-reflected light. The fourth is an insulating tunneling layer less than 15 Angstroms thick for coupling a front collection grid to the "window". Covering the fourth layer is a triple-layer, anti-reflection coating (ARC) whose middle layer bonds the outer ARC layers and secondarily protects the cell from atmospheric degradation. An internally refelective rear ARC layer cooperates with the "window" for returning back-reflected light. The frontmost ARC layer is mainly comprised of $Al_2O_3/S_iO_2$ in the range of 200 to 650 Angstroms thickness. The cell backside is shown having undulations for randomizing reflected light rays. The six front layers effectively adapt the cell for receptivity to solar radiation from about 4,000 to about 12,000 Angstroms, excluding radiation outside thereof, thus accepting 68 percent of solar energy vertically reaching the earth's surface.

38 Claims, 11 Drawing Figures

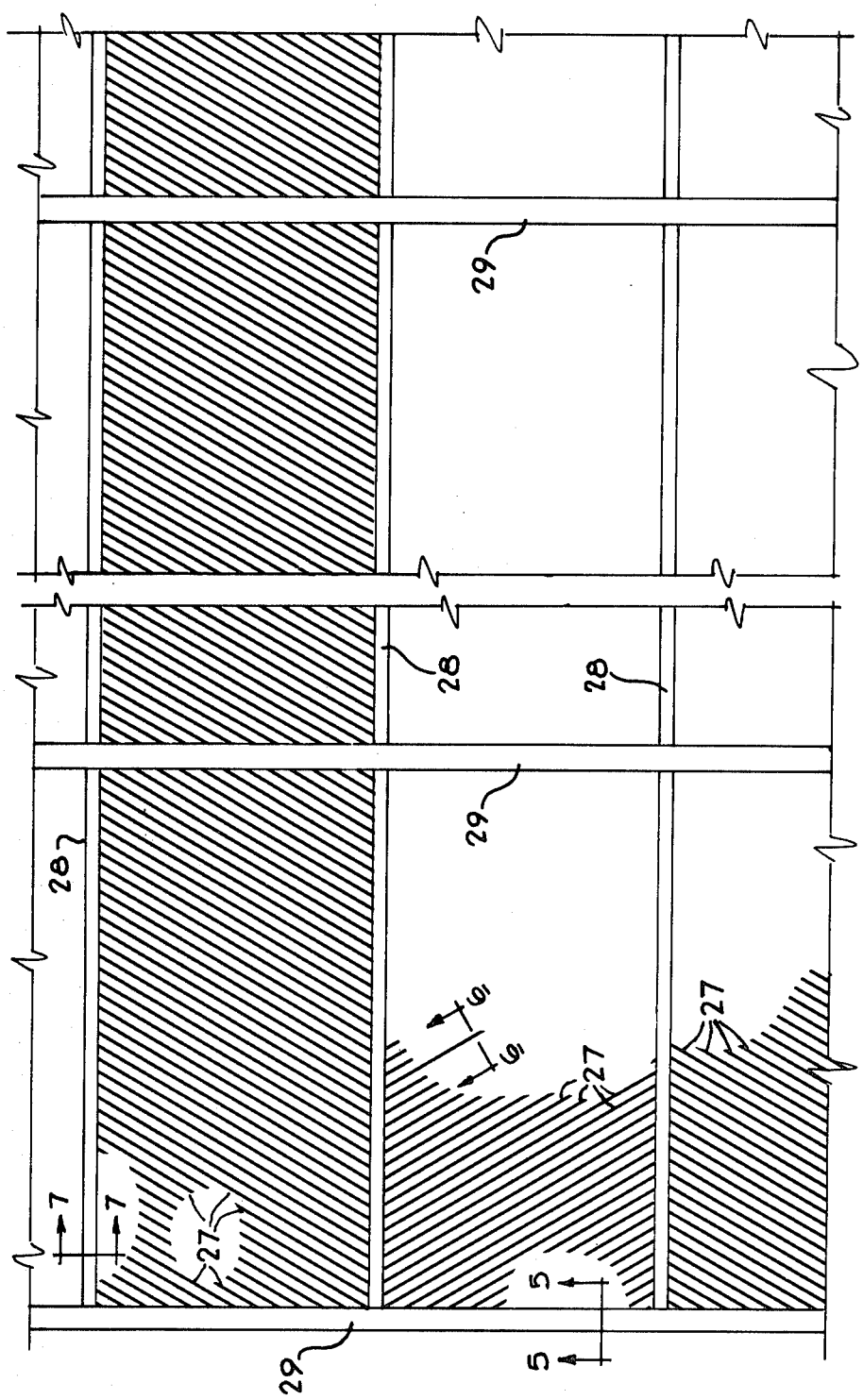

MULTI-LAYER THIN-FILM, FLEXIBLE SILICON ALLOY PHOTOVOLTAIC CELL

TECHNICAL FIELD OF THE INVENTION

The present invention is in the field of silicon photovoltaic cells and more particularly relatively thin, mass-produced, flexible, multi-layer silicon alloy solar cells having an enhanced efficiency and method and apparatus for producing same.

BACKGROUND OF THE INVENTION

Silicon is a quite brittle material which is quite difficult to slice thinner than approximately 250 microns. Since the minority electrical carrier diffusion length through single-crystal silicon material averages about 200 microns at an intensity of one sun through air mass one (AM1), only a relatively small proportion of the electrical carriers generated by incident solar radiation can be collected in a silicon cell having such a thickness as 250 microns. Therefore, the overall conversion efficiency of such thick silicon solar cells is low.

Consequently, attempts have been made in the prior art to produce thinner, wafer-type silicon solar cells. Prior art attempts to produce silicon photovoltaic cells much thinner than 250 microns have involved expensive, time-consuming lapping procedures for producing a micro-smooth surface, followed by expensive, time-consuming etching procedures considerably raising the cost of the completed cell and considerably limiting the overall production rate capability. Even when these procedures are used to produce thin silicon solar cells, their conversion efficiencies in commercially produced wafer-type units seldom exceed 15% at one sun at AM1.

Attempts have been made in the prior art to pull ribbons of silicon directly from a melt. To date such ribbon-pulling-produced solar cells have been plagued by defects and have occasionally, but not consistently, exhibited conversion efficiencies in laboratory-produced (not commercially produced) units up to approximately 16% at one sun at AM1, with a ribbon thickness of approximately 100 microns. The rate at which each such ribbon has been pulled from a melt is very slow, being of the order of one to twenty square centimeters of ribbon per minute at a thickness of less than 150 microns.

As used herein, "one sun" means the intensity of solar radiation as actually received from the sun without augmentation.

As used herein, "air mass one" or "AM1" means the average maximum solar radiation received at the earth's surface at sea level resulting from solar radiation passing vertically through one thickness of atmosphere.

SUMMARY OF THE DISCLOSURE

The present invention overcomes or substantially eliminates the shortcomings of the prior art as applied to thin silicon solar cells. This invention enables thin-film silicon solar cells to be produced relatively rapidly and at significantly lower costs as compared with the prior art.

A multi-layer, thin-film, flexible silicon alloy solar cell is described in which the multiple layers extend perpendicularly to the incident light. The flexible cell is mass-produced by rolling and laminating two thin ribbons of silicon alloy having thicknesses of the order of 10 to 50 microns. with each ribbon passing through multiple rolling stages employing a ceramic metallic glass semi-conductor alloy of silicon having approximately a zero coefficient of thermal expansion/contraction. The rolling pressure in at least one of the rolling stages is applied while this silicon alloy is in a semi-liquidus condition for producing plastic deformation enhancement of the material.

This ceramic metallic glass alloy of silicon melts at a relatively low temperature in the range from approximately 800° C. to 1,150° C. (1,472° F. to 2,102° F.). In contrast, the liquidus temperature of silicon is 1,410° C. (2,570° F.). By virtue of this relatively low melting temperature of the silicon alloy, the rolling and doping of each moving ribbon can be carried out at a correspondingly relatively low temperature, thereby considerably diminishing the tendency of this molten alloy to pick up contaminants from surfaces of the extruding and rolling processing apparatus. This diminished dissolving tendency is an advantage compared with the normal tendency of molten silicon to dissolve and absorb materials from surfaces with which it comes into contact.

During the rolling of the two silicon alloy ribbons, gaseous dopants are applied to them. The rolling pressure on each ribbon facilitates orientation of the crystal lattice structure in the desired direction in the ribbons with relatively few undesired grain boundaries occurring in each ribbon.

The two silicon alloy ribbons are laminated together with a very thin lattice matching layer of less than 60 Angstroms thickness between, and the resultant laminate serves as a substrate on which other layers are deposited. This laminate forms the two main active layers of the photovoltaic cell. The very thin lattice matching layer of less than 60 Angstroms thickness serves to match the crystal lattice structure of these two active layers. This lattice matching layer may be an insulating layer less than 20 Angstroms thick or a semiconducting oxide layer.

On the front of this laminate, i.e. facing the incident radiation, are six additional layers. The lowermost of these six additional layers, that is, the closest to the laminate (called the "sixth" of these six layers) is a semi-insulating layer less than 10 Angstroms thick (preferably 6 to 9 Angstroms thick) containing cobalt and tin applied by metal organic chemical vapor deposition. This thin semi-insulating layer acts as a passivating layer for lowering surface recombination and for helping to minimize the crystal lattice mismatch. Moreover, this sixth layer has a bright green-to-blue color and acts as a spectral filter for excluding incident radiation having a wavelength longer than the middle of the near infra-red range, i.e. having a wavelength longer than approximately 12,000 Angstroms (visible light is in the range from about 4,000 Angstroms to about 7,200 Angstroms) for keeping the cell operating relatively cool by filtering out the longer near infra-red and the far infra-red wavelengths which do not contribute to electrical output of the cell.

The next lowermost (fifth) of these six layers is a semi-conductive "window" layer containing wet-chemical-vapor-deposited tin oxide having a thickness in the range from 300 to 850 Angstroms (preferably 650 to 750 Angstroms). This fifth layer serves as the primary protective layer for protecting the cell from degradation due to attack from oxidizing agents or atmospheric pollution, such as sulphur-containing compounds. This semi-conductive "window" layer is transparent for incoming radiation, but it acts as an optical mirror for internal light rays which have been reflected from the back for preventing escape of these internal light rays. Moreover, this semiconductive window layer advantageously operates as a collection layer in cooperation with the layers beneath.

The next lowermost (fourth) of these six layers is a chemical-vapor-deposited, thin insulating layer less than 15 Angstroms thick for electrically insulating a front electrical collection grid from the semi-conductive window layer described immediately above. This thin insulating layer acts as a tunneling layer for allowing the electrical current carriers to reach the collection grid.

The front three-layer assembly of the six comprises a triple-layer, anti-reflection coating (ARC) covering the front face of the cell. In this three-layer ARC assembly the middle (second) layer serves to bond the other two ARC layers together and advantageously acts as a secondary, protective glass-like layer for protecting the photovoltaic cell from degradation due to attack from oxidizing agents or pollutants in the atmosphere.

In this three-layer ARC assembly there is a reflective rear (third) layer which cooperates with the transparent mirror-like "window" layer described above for advantageously acting as an internal mirror. This internal mirror advantageously causes radiation in the visible range of the electromagnetic spectrum ("light rays") to be reflected back and forth within the cell between the rear and front of the cell for traversing the light rays multiple times back and forth through the cell for improving the likelihood of photovoltaic interaction between the photons of light and the active photovoltaic regions of this cell.

In this three-layer ARC assembly, there is a top (first) layer mainly comprised of silicon dioxide having a thickness in the range from 200 to 650 Angstroms. This top layer is on the front face of the solar cell.

The six layers described above which are on the front of the ribbon laminate effectively adapt the overall cell to be receptive to incident solar radiation in the range from about 4,000 to about 12,000 Angstroms and effectively to exclude radiation outside of this range. This range comprises approximately 68 percent of the solar radiant energy reaching the earth's surface vertically through the thickness of one atmosphere.

The rear of the laminate, which forms the rear of the cell, preferably has an undulating configuration for redirecting the reflected light rays along randomized paths for further improving the likelihood of interaction of the photons with these active regions.

Method and apparatus are described for producing the two ceramic metallic glass semi-conductor silicon alloy ribbons and for laminating them together.

BRIEF DESCRIPTION OF THE DRAWINGS

The invention, together with further objects, features, advantages and aspects thereof will become more clearly understood from a consideration of the following description in conjunction with the accompanying drawings in which like elements will bear the same reference numerals. The drawings are not necessarily drawn to scale, emphasis instead being placed upon clearly illustrating this invention in the best mode now contemplated for putting this invention into practice.

FIG. 3 is an enlargement of a portion of FIG. 2.

FIG. 6 also corresponds to an enlargement of the front contact seen in FIG. 1 and an enlargement of this same front contact seen at the left in FIG. 5.

FIG. 9 is a diagrammatic illustration of the ribbon laminate production method and apparatus.

FIG. 10 is a diagrammatic illustration of further production method and apparatus continuing from the right of FIG. 9.

DETAILED DESCRIPTION OF PREFERRED EMBODIMENTS

Figure 1:
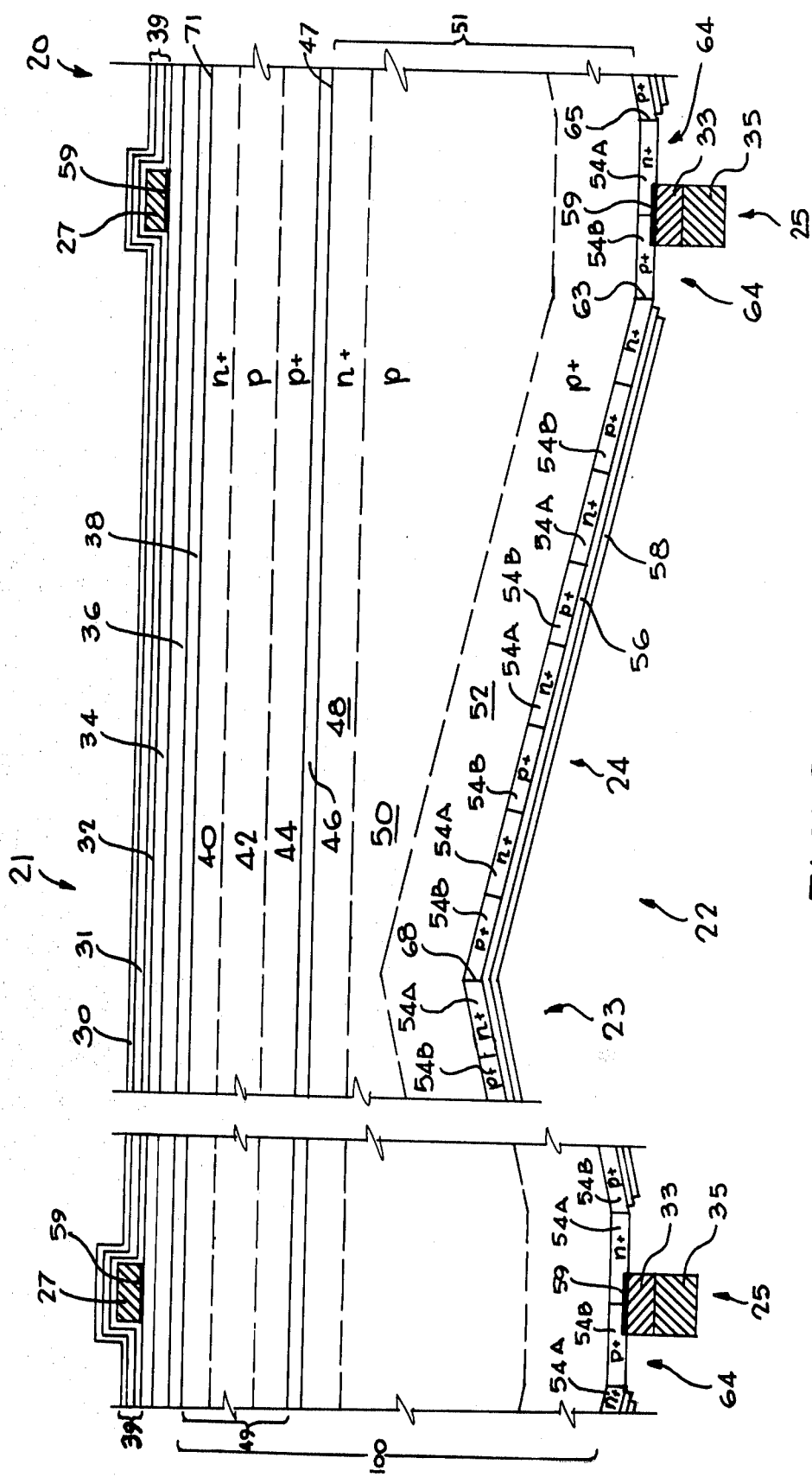
FIG. 1 is an enlarged cross section of a portion of a solar cell embodying the present invention.

FIG. 1 is a partial cross-sectional elevational view of a multi-layer, thin-film, flexible photovoltaic cell 20 embodying the present invention. The various layers of this cell are not drawn to scale whether vertically or horizontally, but rather are drawn to illustrate clearly the principles of this invention. The front (top) is indicated at 21 and is intended to face the incident solar radiation. This front 21 is generally planar except for the regions in which are located the front contact members 27 (FIG. 4), the intermediate bus bars 28 (best seen in FIGS. 3 and 4), the main bus bars 29 (FIGS. 3 and 4), and the side rail buses 26 (FIGS. 2 and 8), which will be described in detail further below.

The rear (bottom) is indicated at 22, and it preferably has a non-planar configuration, being defined by a sequence of pairs of sloping planes 23 and 24 with rear contact members 25 extending along the lowermost regions between these sloping planes 23 and 24, as will be described in detail further below.

Figures 9, 10:
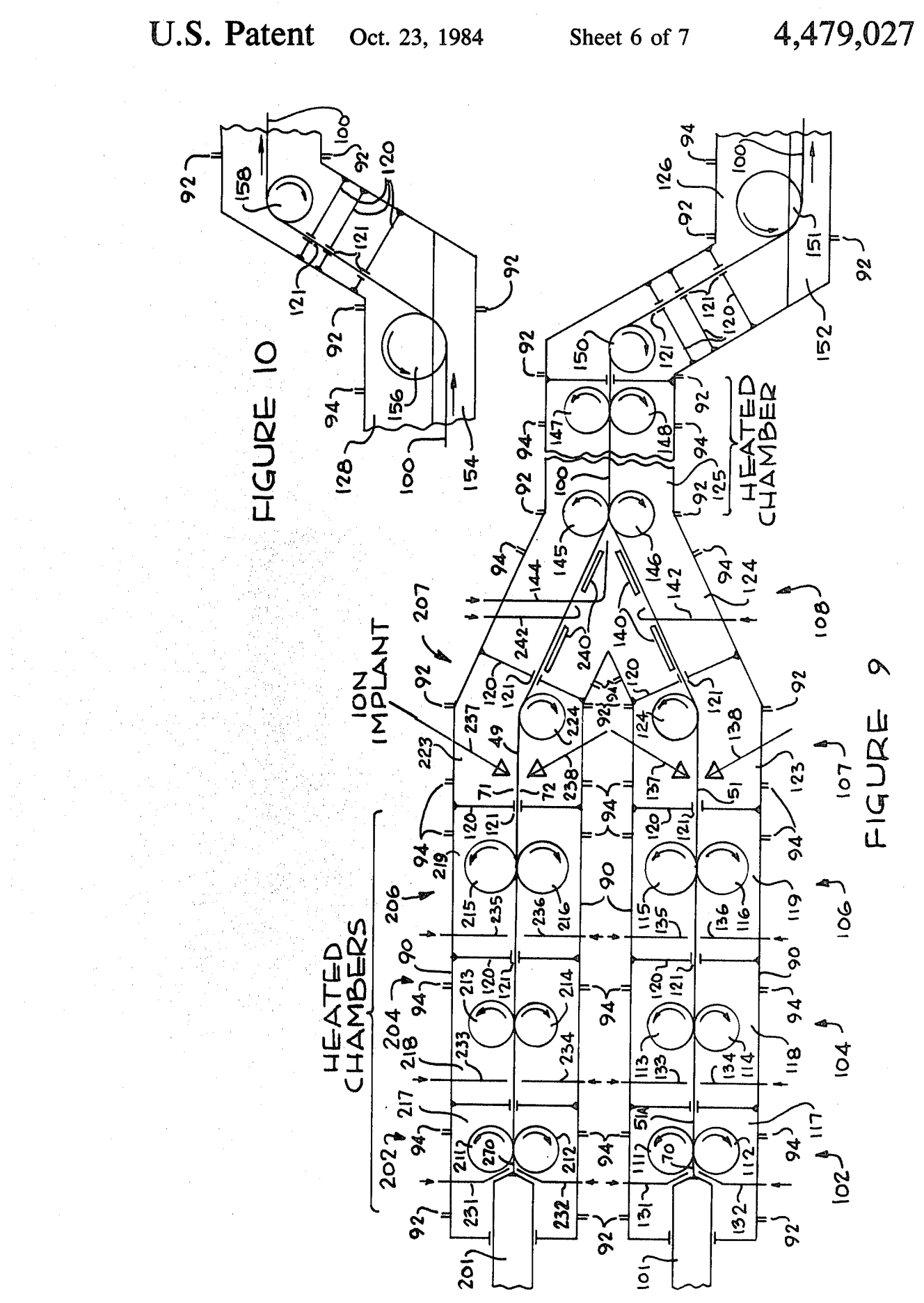
Figure 11:
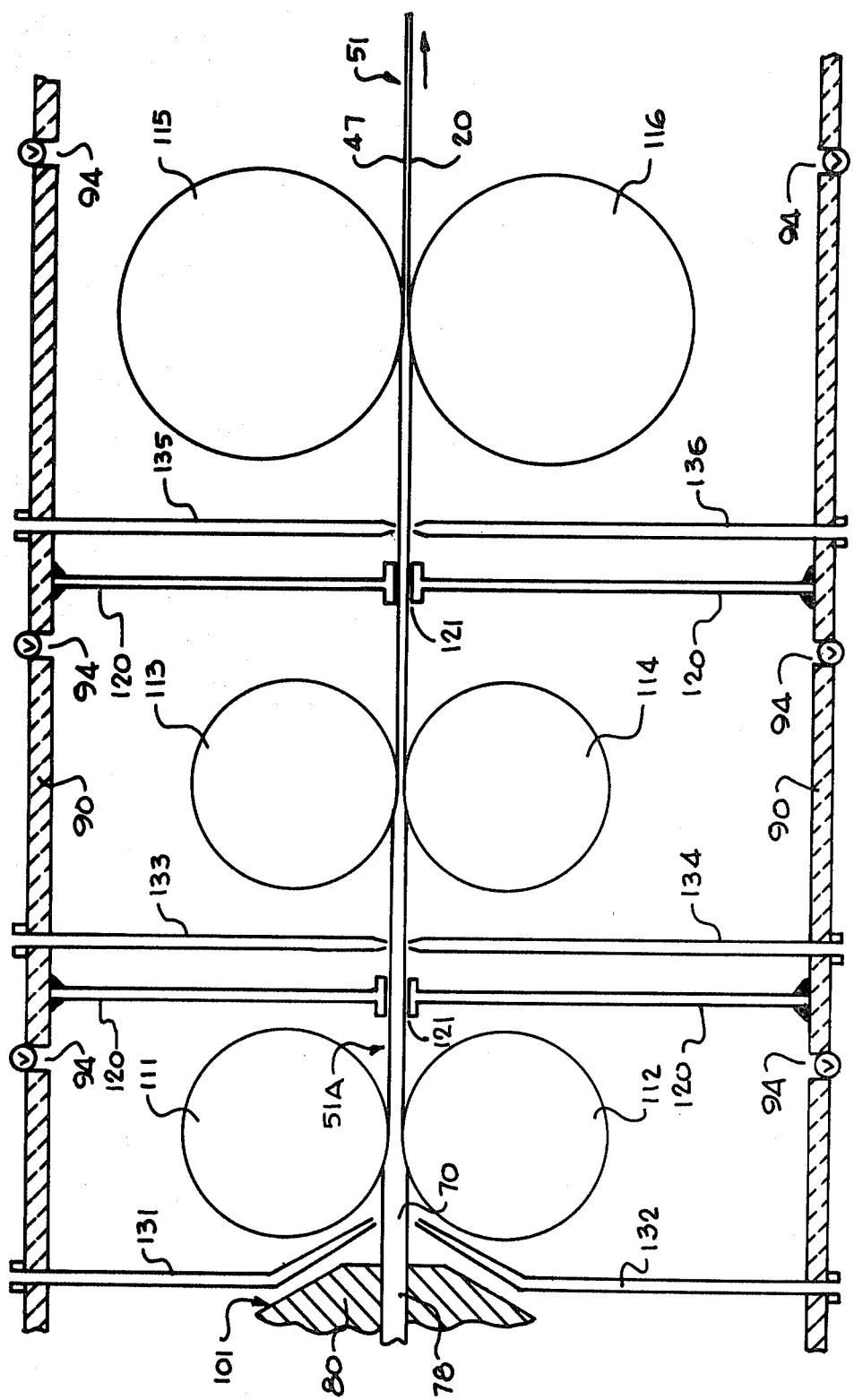
FIG. 11 is an enlarged view of a portion of FIG. 9.

During fabrication of this flexible, thin-film photovoltaic cell 20, the first step is formation of a substrate ribbon laminate 100 by the method and apparatus shown in FIGS. 9, 10 and 11. There is a first extruder 101 for extruding a molten viscous ceramic metallic glass silicon alloy forming a pre-ribbon 51A (FIGS. 9 and 11) passing through a sequence of rolling stations 102, 104, 106, respectively, including pairs of opposed rollers 111 and 112, 113 and 114, 115 and 116 located in a sequence of heated chambers 117, 118 and 119, respectively. These chambers are separated from each other by partitions 120. Each such partition 120 includes a baffled port 121 for enabling the moving ribbon to travel through this port while preventing any significant flow of the gaseous content of a chamber into a neighboring chamber. It is to be understood that each port 121 may include a plurality of baffles extending close to the travelling ribbon for preventing the gaseous content of one chamber from entering the next chamber.

There are pairs of gaseous diffusion tubes 131 and 132, 133 and 134, 135 and 136 extending into the respective chambers 117, 118 and 119. These gaseous diffusion tubes disperse gaseous dopants onto the opposite surfaces of the hot moving ribbon of silicon alloy. By virtue of the fact that the rolling pressure of the opposed pairs of rollers 111 and 112, 113 and 114, 115 and 116 is applied to the hot silicon alloy ribbon soon after the gaseous dopant has been dispersed onto the hot upper and lower surfaces thereof, the rate of diffusion of the dopant into the ribbon is enhanced, as compared with the prior art procedures of diffusing dopant into already crystallized silicon material. This hot silicon alloy ribbon 51A is reduced in thickness as it passes between the opposed pairs of rollers in the rolling stations 102, 104 and 106. The ribbon after reduction in thickness is shown at 51 in FIG. 9 exiting from the roller station 106 and entering an ion implant station 107.

Before describing the ribbon laminate production method and apparatus further, attention is invited to FIG. 1. It is seen that the substrate ribbon 51 has a planar front surface 47 and preferably an undulating rear surface 22. This undulating rear surface 22 includes a repetitive sequence of pairs of sloping planes 23 and 24 each of which slopes at an acute angle in the range from approximately 10° to 15° to the horizontal. There are planar areas 64 located between and contiguous with the lower limits 63 (FIG. 1) of the downwardly sloping planes 24 and the lower limits 65 of the next successive upwardly sloping planes 23. This ribbon 51 has a nominal thickness of approximately 35 microns plus or minus 5%, i.e. ±1.75 microns. In other words, this ribbon 51 has a thickness of approximately fourteen ten thousandths of an inch (0.0014) inch.

This substrate ribbon 51 varies in thickness due to the presence of the sloping planes 23 and 24. The minimum thickness occurs in the vicinity of the peaks 68 of the pairs of sloping planes 23 and 24 and is in the range from approximately 18 microns to 26 microns, depending upon the tolerances and depending upon whether the slope angle is nearer 15° to 10°. The peak-to-peak distance between the successive peaks 68 is approximately 150 microns (six thousandths of an inch).

This ribbon 51 is formed as shown in FIG. 11 by extruding viscous molten silicon alloy material 70 from the extruder 101. This alloy 70 is a ceramic metallic glass alloy of silicon which melts at a relatively low temperature in the range of approximately 800° C. to 1,150° C. The alloy 70 is in a semi-liquidus condition as it enters the nip region 122 (FIG. 11) between the first pair of rollers 111, 112. This alloy composition 70 for forming the rear ceramic metallic glass silicon alloy semiconductor ribbon 51 is characterized by the indicated weight percent of the following elements:

| Ingredient | Range in Weight Percent of Total Composition |
|---|---|
| Silicon | 51–88% |
| Lithium | 3–30% |
| Aluminum | 0.5–29% |
| Fluorine | 0.5–8% |
| Hydrogen | 1–12% |
| Vanadium | 0–5% |
| Trace Elements, Including Oxygen | Less than 0.19 |

An example of a presently preferred composition of this ceramic metallic glass silicon alloy semiconductor material 70 is:

| Ingredient | Weight Percent of Total Composition |
|---|---|
| Silicon | 66.5 to 68.1% |
| Lithium | 22.6% |
| Aluminum | 2.3% |
| Fluorine | 1.5% |
| Hydrogen | 5.5% |
| Vanadium | Less than 1.5% |
| Trace Elements | Less than 0.1% |

Inviting attention back to FIG. 11, the nip region 122 is between cooled circular cylindrical rollers 111 and 112. The surfaces of these opposed counter-rotating rollers 111 and 112 are micro-roughened by selectively etching their surfaces for providing a grip (traction) on the viscous alloy 70. These rollers 111, 112 are adjustably spaced apart for producing the first ribbon stage 51A. It is to be noted that these rollers have a diameter of at least 15 centimeters and are formed of a machineable ceramic glass alloy which is cast and then machined and ground to tolerance, followed by the etching step for producing traction as discussed.

The ceramic glass alloy composition of the rollers 111, 112 is made as follows: Silica is dry mixed as a powder with alumina powder and with lithium dioxide powder. This lithium dioxide comes in the form of the naturally occurring mineral Petalite or Spodumene, preferably using the latter mineral, because it is more readily obtained in the United States. The dry mixture is heated in a crucible made of alumina or SIALON or SION, or fused quartz or silicon nitride. When molten, the composition is purified to remove substantially all oxygen and other trace elements which would contaminate the ribbon being rolled. The purified roller composition is characterized by the indicated weight percent of the following elements:

| Ingredient | Weight Percent of Total Composition |
|---|---|
| Silicon | 50 to 70 |
| Aluminum | 10 to 25 |
| Lithium | 5 to 35 |
| Oxygen & Trace Elements | Less than 1 |

As explained above, this machineable ceramic glass alloy composition is cast to shape, machined and ground to tolerance and then selectively etched for providing surface traction of the rollers 111, 112 on the molten alloy 70.

The molten alloy 70 entering the nip 122 is formed by extrusion through a wide slot orifice 78 in the nozzle 80 of the extruder 101. The vertical dimension of the slot orifice 78 is considerably greater than the spacing between the pair of opposed rolls 111, 112. The extruder and its interchangeable nozzle 80 are formed of a machineable ceramic glass composition including the above ingredients. The machineable ceramic glass for the extruder and its nozzle is more refractory than that used to make the rollers. The width of the wide slot orifice 78 is at least 4 centimeters, and the slot has a height of at least 100 microns for forming an extrudate ribbon mass 70 of approximately these dimensions.

As described above, the rollers 111, 112 are adjustably spaced apart, thereby producing the first stage ribbon 51A with a thickness reduction of at least 30% from the entering mass.

Between the nozzle 80 and this first pair of rollers are shown gaseous diffusion tubes 131, 132, respectively, aimed at the opposite surfaces of the material 70 for dispersing gaseous dopants onto these surfaces. The gaseous dopants are being released from these tubes 131, 132 at a pressure exceeding one atmosphere. These gaseous dopants are attracted to the hot upper and lower surfaces of the semi-liquidus alloy material 70. The advantage of the rolling action and pressure in the various rolling stations 102, 104, 106 enhancing the diffusion of the dopants into the ribbon 51A is discussed above. After the first stage ribbon 51A has passed between the cooled rollers 111 and 112, it is in a semi-solidus condition. The relatively minute mass of this silicon alloy material 70 between these rollers enables the alloy to be very rapidly cooled from its semi-liquidus to its semi-solidus condition, thereby advantageously causing plastic deformation with quick cooling for orienting the multi-crystalline structure in the direction of rolling, i.e. parallel with the front and rear surfaces of the ribbon 51 being formed.

It is my theory that this orientation will slightly raise the upper limit of the band gap of the silicon alloy ribbon for making the substrate 51 of the solar cell responsive photovoltaically to visible light over a broader frequency range, i.e. extending up to a slightly higher frequency than would occur in this same alloy material without such rolling. However, this theory, whether borne out in practice or not, is not critical to the present invention. Its effect, if present, is a further advantage of this production method and apparatus.

The gaseous dopant which may be supplied through the tube 131 is a phosphorous-containing gas, for example, phosphine ($PH_3$). This same gaseous dopant is supplied through the other tubes 133 and 135 which face the same "front" surface of the ribbon 51 being formed. Depending upon desired dopant density and gaseous distribution, any one, or more, or all of these tubes 131, 133 and 135 may be utilized.

It is noted, as indicated above, that the term "front" or "top" is intended to indicate a region in the completed cell 20 facing toward the incident light radiation, while the term "rear" or "bottom" is intended to mean a region in the cell facing away from the incident light.

The gaseous dopant being supplied through the tubes 132, 134 and 136 to the "rear" surface of the ribbon 51 being formed is a boron-containing gas, for example, boron trifluoride ($BF_3$). Depending upon desired dopant density and gaseous distribution, any one, or more, or all of these tubes 132, 134 and 136 may be utilized.

The second pair of adjustably spaced circular cylindrical rollers 113 and 114 in station 104 are constructed the same and have micro-roughened surfaces the same as the first pair 111, 112 in station 102.

These rollers 113 and 114 are adjusted to produce a reduction in thickness in the travelling ribbon of at least 30%.

The third pair of rollers 115 and 116 are adjustably spaced and are arranged to produce the exiting ribbon 51 having the thickness dimensions described above. This exiting ribbon has a width of at least 11 centimeters. The rollers 115 and 116 are constructed of the same material as the first and second pairs 111, 112 and 113, 114. The roller 115 is at least 20 cm in diameter and has a ground micro-smooth circular cylindrical surface. The circular cylindrical surface of the roller 116 which has a diameter of at least 20 cm is preferably machined to have a textured pattern which is the negative of the desired rear pattern 22 (FIG. 1) for producing this rear pattern 22. Alternatively, the surface of the roller 116 may be micro-smooth for producing a planar rear surface 22 on the ribbon 51.

The planar areas 64 and peaks 68 in the rear surface 22 extend parallel with each other and are oriented at an angle of approximately 60° with the length of the ribbon. They are arranged in a chevron pattern similar to the chevron pattern of the front contact members 27 (FIG. 3). The chevron pattern on the rear 22 is shifted laterally relative to the chevron pattern on the front 21 by an amount equal to the spacing between the intermediate bus bars 28 (FIG. 3), so that the planar areas 64 with their contact members 25 are oriented at an angle with respect to the front contact members 27.

Although three rolling stations 102, 104, 106 are shown, it is to be understood that more such stations may be included, depending upon the initial thickness of the extrudate 70 and the percentage reduction in each station. Also, it is to be understood that these stations 102, 104 and 106, and the ion implant station 107, may be arranged in a vertical line for causing the ribbon being rolled to travel vertically in the earth's gravitational field.

In the ion implant station 107, there is an evacuated chamber 123 containing ion guns 137, 138 which are preferably aimed at an acute angle, as shown, toward opposite surfaces of the advancing ribbon 51. The ion gun 137 is supplied with a gas containing phosphorous, for example, a mixture of phosphine and hydrogen. The other ion gun 138 is supplied with a gas containing boron, for example, a mixture of boron trifluoride and hydrogen.

The ribbon 51 passes a guide roller 124 and enters a laminating station 108. In this laminating station 108 there is a chamber 124 containing a plurality of electric heaters 140 for raising the temperature of the front surface 47 (FIG. 9) of the ribbon 51. A tube 142 feeds oxygen onto the heated front surface 47 for causing diffusion of the oxygen into this surface for forming the thin lattice matching layer 46 (FIG.1). This lattice matching layer 46 may be an insulating oxide layer less than 20 Angstroms thick or a semi-conducting oxide layer less than 60 Angstroms thick. Another tube 144 for aiding in forming this lattice matching layer 46 feeds oxygen into the region where the heated ribbon 51 is pressed by opposed adjustably spaced rollers 145, 146 against another heated ribbon 49 for forming the laminated ribbon 100. These laminating-pressure rollers 145 and 146 are constructed of the same material as the rollers 111 and 112. The laminating-pressure rollers 145 and 146 have micro-smooth surfaces and a diameter of at least 15 cm. If the roller 116 is textured, then preferably the roller 146 is similarly textured and is synchronized in motion with the existing pattern on the rear of the ribbon 51 for engaging this existing pattern without unduly distorting it. The roller 146 will then have the same diameter as the roller 116, and the roller 145 will have the same diameter as its opposed roller 146.

The ribbon 49 is formed as shown in FIG. 9 by extrusion of an extrudate 270 plus rolling, utilizing an extruder 201 followed by rolling stations 202, 204, 206 in which there are chambers 217, 218, 219, containing pairs of adjustably spaced rollers 211 and 212, 213 and 214, 215 and 216, respectively. The extruder 201 is identical to the extruder 101, and the rollers 211, 212, 213 and 214 are identical to the rollers 111, 112, 113 and 114. The rollers 215 and 216 are identical to the roller 115, and each has a micro-smooth surface for forming the planar front and rear surfaces 71 and 72 (FIG. 9) of the ribbon 49. The ribbon 49 has a thickness in the range from 15 to 20 microns and is at least 11 cm wide. The ceramic metallic glass semiconductor silicon alloy composition of the extrudate 270 for forming the ribbon 49 is characterized by the indicated weight percent of the following elements:

| Ingredient | Range in Weight Percent of Total Composition |
| --- | --- |
| Silicon | 51–88% |
| Lithium | 3–30% |
| Aluminum | 0.5–29% |
| Fluorine | 0.5–8% |
| Hydrogen | 0.5–12% |
| Antimony | 0.01–20% |
| Cobalt | 0.01–6% |
| Trace Elements, Including Oxygen | Less than 0.1% |

An example of a presently preferred composition of this ceramic metallic glass semiconductor silicon alloy material 270 is characterized by the indicated weight percent of the following elements:

| Ingredient | Range in Weight Percent of Total Composition |
| --- | --- |
| Silicon | 59.5–63.5% |
| Lithium | 25% |
| Aluminum | 4.9% |
| Fluorine | 1.3% |
| Hydrogen | 5.3% |
| Antimony | Less than 3% |
| Cobalt | Less than 1% |
| Trace Elements, Including Oxygen | Less than 0.1% |

Although three rolling stations 202, 204, 206 are shown, it is to be understood that more such stations may be included, depending upon the initial thickness of the extrudate 270 (FIG. 9) and the percentage reduction in each station. Also, it is to be understood that these stations 202, 204 and 206 and an ion implant station 207 may be arranged in a vertical line for causing the ribbon being rolled to travel vertically in the earth's gravitational field. The laminating station 108 may be arranged for travelling the two ribbons 49 and 51 essentially vertically as they are directed along converging paths and laminated.

There are tubes 231, 233, 235 and 232, 234, 236 for feeding gaseous dopants onto the front and rear surfaces, respectively, of the ribbon being rolled. The gaseous dopant supplied for the front surface of the ribbon 49 is phosphine, and that supplied for the rear surface is boron trifluoride. Depending upon the desired dopant density and gaseous distribution, any one, or more, or all of these tubes 231 through 236 may be utilized.

The ribbon 49 passes through an ion implant station 207 in which there is an evacuated chamber 223 containing ion guns 237, 238 which are preferably aimed at an acute angle, as shown, toward opposite surfaces 71, 72 of the advancing ribbon 49. The ion gun 237 is supplied with a gas containing phosphorous, for example a mixture of phosphine and hydrogen. The other ion gun 238 is supplied with a gas containing boron, for example, a mixture of boron trifluoride and hydrogen.

The ribbon 49 passes a guide roller 224 and enters the laminating station 108 in which the electric heaters 240 raise the temperature of the rear surface 72. A tube 242 feeds oxygen or nitrogen onto the heated rear surface 72 for causing diffusion of oxygen or nitrogen into this surface for forming the thin lattice matching layer 46 (FIG. 1) described above. The laminating-pressure rollers 145, 146 press the rear surface 72 of ribbon 49 against the front surface 47 of ribbon 51 for laminating them together to form the laminated ribbon 100.

It is to be understood that the thin lattice matching layer 46 (FIG. 1) formed in the laminated ribbon 100 includes thin portions of the rear and front surfaces 72 and 47, respectively, of the ribbons 49 and 51.

The laminated ribbon 100 passes between other pairs of opposed adjustably spaced rollers 147 and 148 in a heated bonding chamber 125 for causing the laminated ribbon to bond securely together. If the roller 116 is textured, then the rollers 148 and 147 preferably meet the same criteria as discussed above for rollers 146 and 145.

In the rolling chambers 117, 118 and 119, the ribbon 51 being formed is heated preferably to be at a level of approximately 20° C. to 60° C. below the semi-liquidus condition. Similarly, in the rolling chambers 217, 218, 219, the ribbon 49 being formed is heated preferably to be at said temperature level. In the laminating and bonding chambers 124 and 125 the ribbons 49, 51 and the laminated ribbon 100 are heated preferably to a level of approximately 20° C. to 60° C. below their semi-liquidus temperature. This temperature level is the preferred temperature for promoting crystal growth and orientation of crystals in the ribbons while rolling.

The opposed rollers in each pair are interconnected for causing them to rotate in opposite directions at the same speed. Each pair of rollers is driven independently of the other pairs. Means are provided, for example, optical sensors, for sensing any deflection or sag in the moving ribbons or in the laminate. The successive pairs of rollers are driven at appropriate speeds for minimizing any deflection or sag of the travelling ribbon or laminate away from the desired path.

The walls 90 of the chambers 117, 118, 119, 123, 124, 125, 217, 218 and 219 are formed of or lined with the same machineable ceramic glass alloy as the rollers therein. There are air-tight disconnectible flanged joints 92 for enabling disassembly of any chamber for obtaining access to the interior. Also, there are numerous vents 94 leading into the respective chambers which are normally closed by shut-off valves, as indicated in FIG. 11, but which may be opened for removing and changing the gaseous content of any chamber.

The gaseous diffusion and ion implant of dopant produce an n+ type layer 40 and a p+ type layer 44, while the main body 42 of the region 49 of the cell 20 is p type. The gaseous diffusion and ion implant of dopant produce an n+ type layer 48 and a p+ type layer 52, while the main body 50 of the region 51 of the cell 20 is p type.

The laminated ribbon passes a guide roller 150 and travels through baffled ports 121 in a series of partitions 120 and passes a guide roller 151, entering etching chamber 126. The etchant 152 is maintained at a temperature of 90° C. and comprises a one normal solution of hydrogen fluoride in water. The purpose of this etching step is to thoroughly clean the front and rear surfaces of the laminate ribbon 100. Advantageously, the temperature levels in the rolling, laminating and bonding stations as described promote crystal growth and orientation of the crystals. Then, the relatively cool etchant 152 at a temperature of 90° C. produces a rapid quench, thereby supercooling the laminate 100 and immediately stopping further crystal growth when the crystals are at their optimum crystalite size. The guide roller 151 is formed of material not dissolvable in the etchant 152. After the etching is completed, the travelling ribbon 100 passes another guide roller at the opposite end of the etching bath 152 from the guide roller 151 and exits from this bath.

The etched ribbon 100 is introduced into a rinse bath 154 (FIG. 10) in a rinse chamber 128. The rinse bath 154 is methanol. After the rinsing step is completed, the travelling laminate ribbon 100 passes a guide roller 156 and exits from the rinse bath 154. The rinsed travelling ribbon 100 passes through a series of baffled ports 121 in a sequence of partitions 120 and passes a guide roller 158 in readiness for further processing steps to be described.

The layer 38 (FIG. 1) is a semi-insulating layer less than 10 Angstroms thick and preferably in the range from 6 to 9 Angstroms thick. This thin, semi-insulating layer acts as a passivating layer for lowering surface recombination and for helping to minimize crystal lattice mismatch. This layer 38 is formed by metal organic chemical vapor deposition of cobalt nitride (CoN) together with tin oxide ($SnO_2$) onto the front surface of the laminate 100, at a ratio of approximately 58% cobalt nitride and approximately 42% tin oxide by weight at a temperature of approximately 460° C. This layer 38 containing cobalt and tin has a bright green-to-blue color and also advantageously acts as a spectral filter for excluding incident radiation having a wavelength longer than the middle of the near infra-red range. In other words, this layer 38 excludes incident radiation having a wavelength longer than approximately 12,000 Angstroms for keeping the cell operating relatively cool by filtering out the longer near infra-red, i.e. wavelengths longer than approximately 12,000 Angstroms, and the far infra-red wavelengths, all of which do not contribute to electrical output of the cell. The layer 38 also filters out ultraviolet radiation and thus prevents cell degradation by ultraviolet radiation damage.

The layer 36 is a semi-conductive "window" layer formed by wet chemical deposition spray of a tin-containing compound in solution, for example of tin fluoride ($SnF_3$) in alcohol in a 75% molar solution or tin chloride ($SnCl_4$) in ethyl acetate in an 80% molar solution. This wet chemical spray deposition is carried out at a temperature in the range from 380° C. to 430° C. This layer 36 has a thickness in the range from 300 to 850 Angstroms (preferably 650 to 750 Angstroms). It acts as the primary protective layer for protecting the cell 20 from degradation due to attack from oxidizing agents or from atmospheric pollution, such as sulphur-containing compounds. This semi-conductive "window" layer 36 advantageously acts as a one-way optical mirror. It is transparent for incoming radiation, but it acts as an optical mirror for internal light rays which have been reflected from the back 22 (FIG. 1) for preventing escape of these internal light rays. In addition, this semi-conductive layer 36 advantageously serves as a collection layer in cooperation with the layers beneath it.

A photo litho resist is applied to the rear 22 (FIG. 1) of the cell for masking the regions 54B. Then, the interdigitated n+ type narrow stripes 54A are doped by chemical vapor deposition of phosphorous-containing dopant to a depth of approximately 1.5 microns.

This resist is removed and is applied to the doped stripes 54A, and then the interdigitated p+ type narrow strips 54B are doped by chemical vapor deposition of a boron-containing dopant to a depth of approximately 1.5 microns. These n+ type and p+ type stripes 54A and 54B, respectively, alternate in position in interdigitated relationship as shown in FIG. 1. These narrow interdigitated stripes each have a width in the range of approximately 7 to 15 microns, depending upon their number. There are a plurality of them located between each of the rear contact members 25, for example, in the range from ten to twenty such interdigitated stripes. Eighteen of the are shown in FIG. 1.

Then, the regions 64 near the positions where the rear contact members 25 will be located are protected by a photo litho resist. The first back surface reflector (BSR) mirror layer 56 of tin is plated or applied by metal organic chemical vapor deposition (MOCVD) preferably at least 50 Angstroms thick. On this layer 56 is then applied by plating or MOCVD a chromioum layer 58 forming a second back surface reflector (BSR) having a thickness in the range from 0.5 to 2 microns.

The resist is applied over the second rear surface reflector 58 and is removed from the region where the rear contact member 25 will be located. Each such double BSR 56,58 may, if desired, also be used as charge carrier collection means by electrically connecting the double BSR to the rear contact members 25.

Strike barriers 59 are then deposited by MOCVD in the rear contact regions. Each such barrier is approximately 100 Angstroms thick and approximately 6 microns wide. These strike barriers 59 are formed of titanium nitride and cobalt nitride, at least 90% titanium nitride by weight and in the range of 1% to 10% cobalt nitride by weight of the total composition of the strike barrier. They prevent migration of silver atoms from the contact member 25 into the silicon alloy 51. They reduce the contact resistance and assure good electroplating adhesion of the silver contact layers 33 to be formed. The resist still covers the entire rear 22 of the cell 20 except at the strike barriers 59.

Toward the front of the cell a thin insulating layer 34 less than 15 Angstroms thick of silicon dioxide is formed by chemical vapor deposition. This thin insulating layer 34 electrically insulates the front contact members 27 to be formed from the semi-conductive window and one-way mirror layer 36 described above. This thin layer 34 acts as a tunneling layer for allowing the electrical current carriers to reach the front collection grid contact members 27.

A resist is applied over the layer 34 except in the regions where the front contact members 27 are to be located. Strike barriers 59 are then chemical vapor deposited similar to those on the rear of the cell for the same purposes.

A resist now covers the entire front and rear of the cell except at the strike barriers 59. It is to be understood that these strike barriers 59 are also located in and have the respective widths of the regions where the intermediate bus bars 28, main bus bars 29, and side rail buses 26 will be located.

Figure 2:
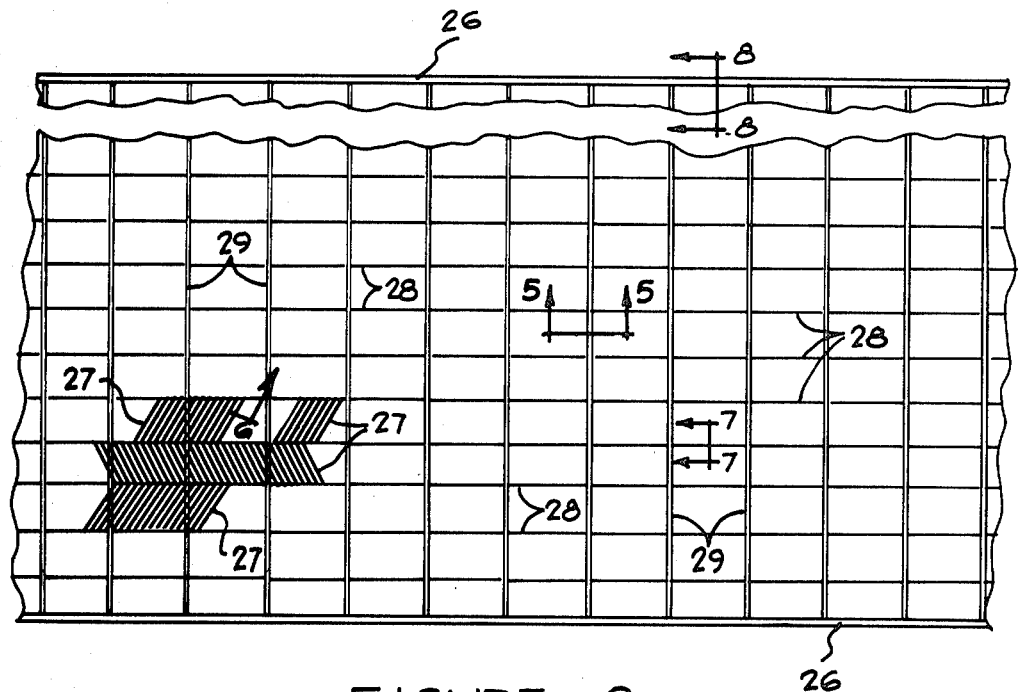
FIG. 2 is a plan view of the front face of the solar cell drawn approximately one and a half times actual size.
Figure 6:
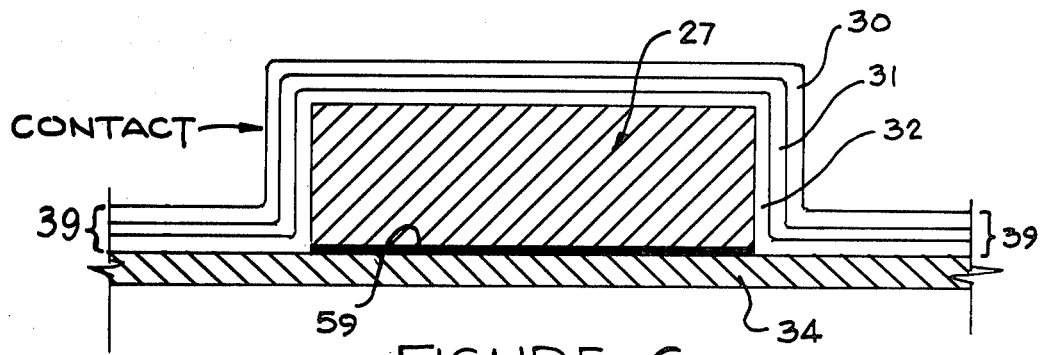
FIG. 6 is an enlarged partial sectional view of one of the front contact members taken along the line 6 in FIG. 2.
Figure 4:
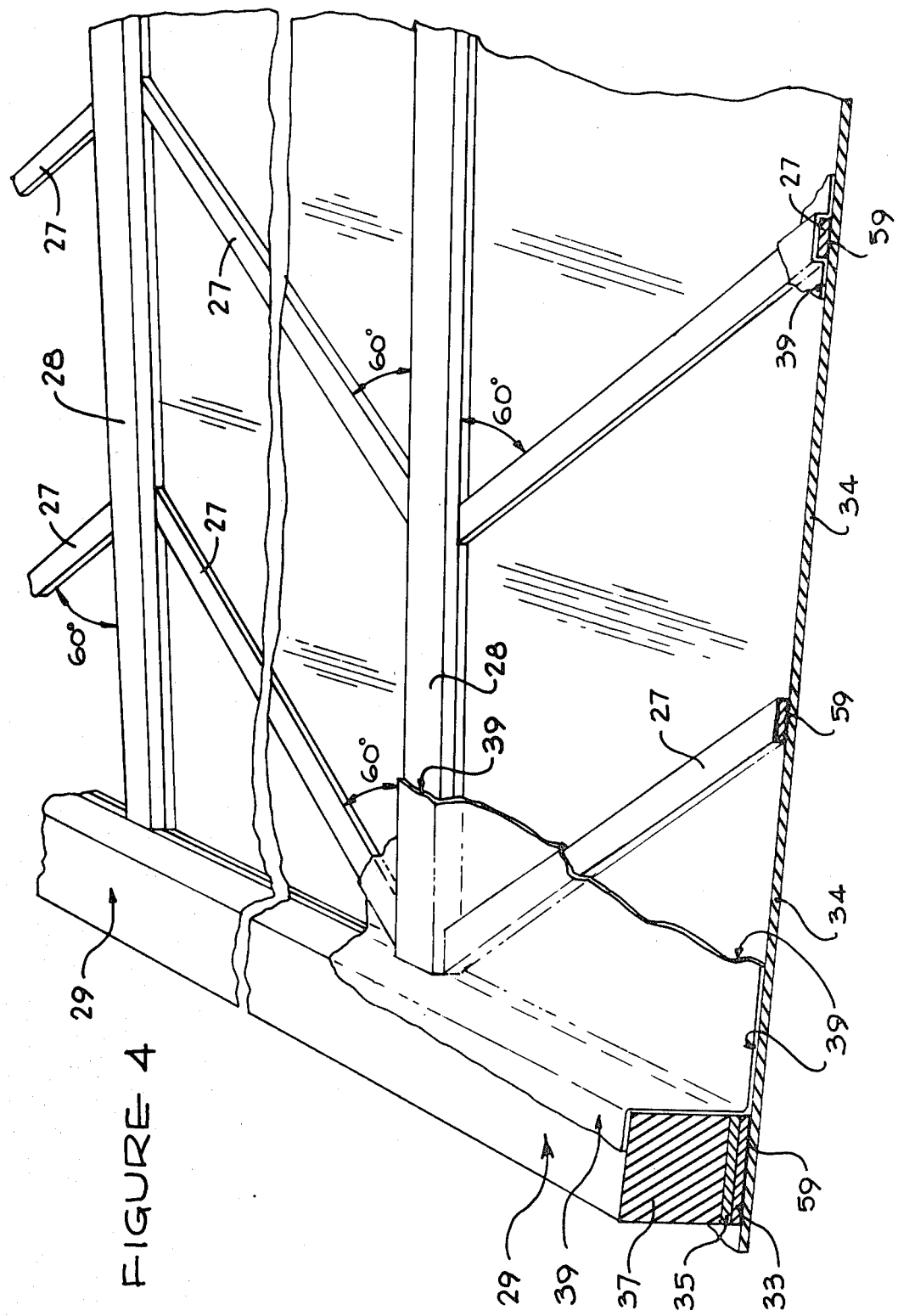
FIG. 4 is a partial perspective view of a portion of FIG. 3 shown further enlarged.

Silver is then plated onto the strike barriers 59 to a depth of approximately 2 microns. This plated silver forms the front contact members 27, which are approximately 6 microns wide, being spaced apart approximately 151 microns on centers and having a chevron pattern as seen in FIGS. 2, 3 and 4. This plated silver also forms the layers 33 as shown in FIGS. 4, 5, 7 and 8.

The silver layer 33 approximately 2 microns thick is also seen in FIG. 1 as the front layer of the rear contacts 25.

A resist is applied over the front contacts 27, and a copper layer 35 (FIGS. 1, 4, 5, 7 and 8) approximately 10 microns thick is then plated over the silver layer 33 for forming the intermediate, main and side rail buses 28, 29 and 26, respectively, and rear contact members 25 (FIG. 1).

Figure 7:
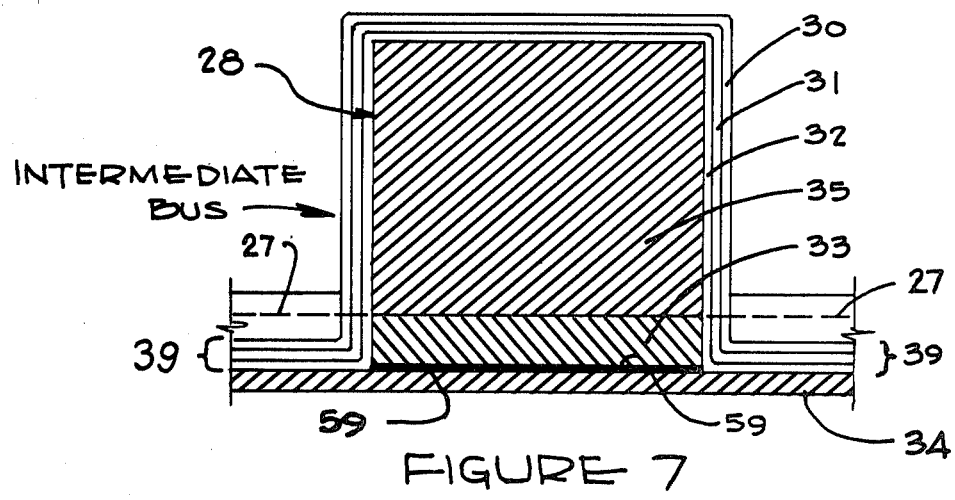
FIG. 7 is an enlarged partial sectional view of an intermediate bus taken along the line 7—7 in FIG. 2.
Figure 5:
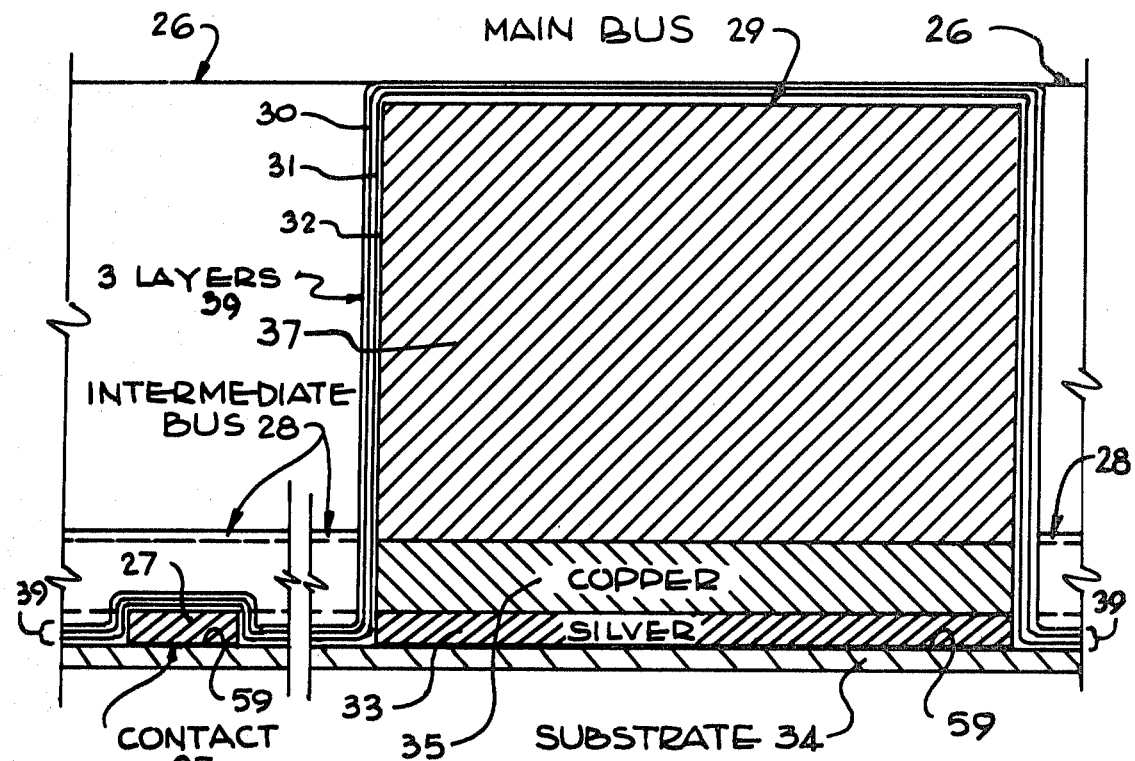
FIG. 5 is an enlarged partial sectional view of a main bus taken along the line 5—5 in FIG. 2.

A resist is then applied over the intermediate bus 28, and solder 37 is applied by a wave solder application technique to form the solder layer 37 of the main buses 29 and of the side rail buses 26 (FIGS. 5 and 7). This solder layer 37 has a thickness of approximately 20 microns. In order to apply these layers 37, the molten solder bath is vibrationally agitated for forming standing waves on the surface of the molten solder. Then, the copper layers 35 to be plated with solder are positioned above the solder bath, so that these copper layers touch the crests of the standing waves, without immersion of the remainder of the cell 20 into the solder bath.

The resist is then removed from the front and rear of the cell, and the lowest (rear) layer 32 of the anti-reflection-coating (ARC) assembly 39 is applied. This ARC assembly 39 is a three-layer coating, and it is applied over the contact members 27, as seen in FIGS. 1, 4, 5 and 6. This ARC assembly 39 also is applied over the intermediate buses 28, over the main buses 29, and over the side rail buses 26, as seen in FIGS. 4, 5, 7 and 8.

The lowest anti-reflection-coating layer 32 comprises a mixture of cobalt nitride and titanium nitride which is formed by chemical vapor deposition. This layer 32 is less than 100 Angstroms thick, and it cooperates with the transparent mirror-like "window" layer 36 described above for advantageously acting as an internal mirror. This internal mirror advantageously causes radiation in the visible range of the electromagnetic spectrum ("light rays") to be reflected back and forth within the cell between the rear and front of the cell for traversing the light rays multiple times back and forth through the cell for improving the likelihood of photovoltaic interaction between the photons of light and the active photovoltaic regions of this cell.

The middle ARC layer 31 serves to bond the other two ARC layers 30 and 32 together and advantageously acts as a secondary, protective glass-like layer for protecting the photovoltaic cell from degradation due to attack from oxidizing agents or pollutants in the atmosphere. This middle ARC layer 31 is a semi-vitreous glass which advantageously serves also as an encapsulant anti-oxidation protective layer. In addition to protecting the interior of the cell from oxidation, this layer 31 also protects the interior by acting partially as a heat-conducting layer which diminishes and disperses any tendency toward localized heating resulting from non-uniform illumination. Further, this middle layer 31 serves as a semi-vitreous bonding medium for bonding together these three ARC layers 30, 31 and 32 to form the assembly 39.

The middle anti-reflection layer 31 is a light-transparent, semi-vitreous glass composition containing silicon dioxide ($SiO_2$), alumina ($Al_2O_3$), boron trioxide ($B_2O_3$), sodium oxide ($Na_2O$) and phosphorous pentoxide ($P_2O_5$). It has a thickness in the range from 50 to 400 Angstroms, the presently preferred thickness being approximately 150 Angstroms. This semi-vitreous glass composition layer 31 contains said ingredients in the following ranges of weight percent of the total composition:

| Ingredient | Weight Percent of Total Composition |
|---|---|
| $SiO_2$ | 67 to 82 |
| $Al_2O_3$ | 5 to 14 |
| $B_2O_3$ | 6 to 18 |
| $Na_2O$ | 4 to 20 |
| $P_2O_5$ | 0.01 to 5 |

The ratio of $SiO_2$ to $Al_2O_3$ in the composition is in the range from 4.8 to 1 to 16.4 to 1.

An example of the composition of this middle anti-reflection layer 31 which advantageously serves the various functions described above is:

| Ingredient | Weight Percent of Total Composition |
|---|---|
| $SiO_2$ | 73 |
| $Al_2O_3$ | 7 |
| $B_2O_3$ | 10 |
| $Na_2O$ | 8.7 |
| $P_2O_5$ | 1.3 |

In this example, the ratio of $SiO_2$ to $Al_2O_3$ is 10.4 to 1.

Another example of the composition of this middle anti-reflection layer 31 which advantageously serves the various functions described above is:

| Ingredient | Weight Percent of Total Composition |
|---|---|
| $SiO_2$ | 68 |
| $Al_2O_3$ | 5 |
| $B_2O_3$ | 15 |
| $Na_2O$ | 11.2 |
| $P_2O_5$ | 9.8 |

In this example the ratio of $SiO_2$ to $Al_2O_3$ is 13.6. The layer 31 is bonded to the front surface of said layer 32 by heating the layer 31 to a temperature of from about 750° C. to a temperature of less than about 850° C.

The front light-transparent ARC layer 30 is markly comprised of silicon dioxide ($SiO_2$) having a thickness in the range from 200 to 650 Angstroms, the presently preferred thickness being approximately 450 Angstroms. It constitutes the top ARC layer, is formed by chemical vapor deposition, and is at the very front of the solar cell 20.

The intermediate bus bars 28 (FIGS. 4 and 7) have a width of approximately 15 microns and a thickness of approximately 12 microns, including a silver layer 33 which is 2 microns thick and a copper layer 35 which is 10 microns thick.

The main bus bars 29 (FIGS. 4 and 5) have a width of approximately 48 microns and a thickness of approximately 32 microns, comprising a silver layer 33 (FIG. 5) which is approximately 2 microns thick, a copper layer 35 which is approximately 10 microns thick and a solder layer 37 which is approximately 20 microns thick.

Figure 8:
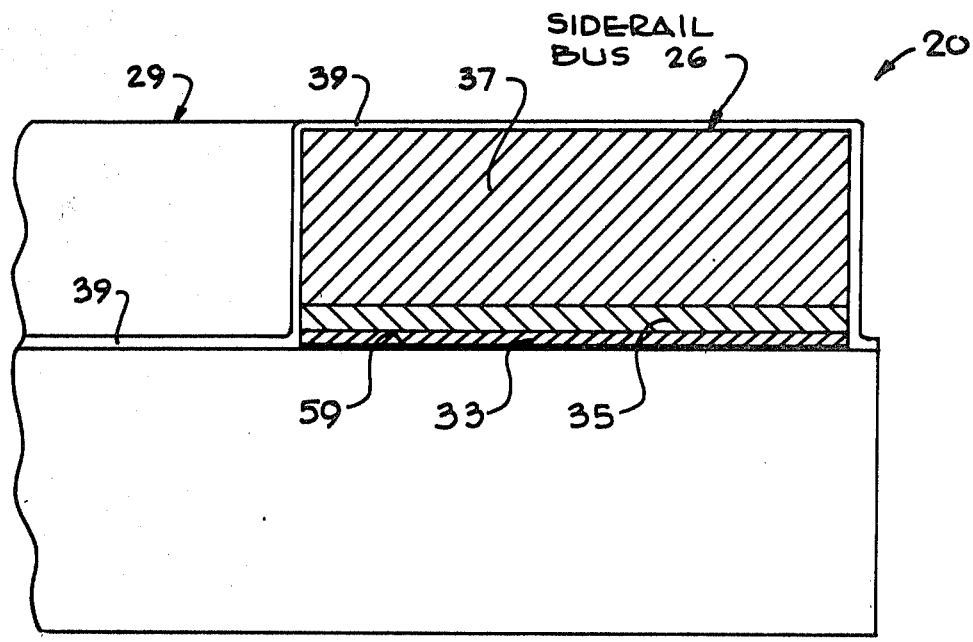
FIG. 8 is an enlarged partial sectional view of a side rail bus, being a section taken along the line 8—8 in FIG. 2.

The side rail buses 26 (FIG. 8) have a width of approximately 96 microns and a thickness of approximately 32 microns, the same as the main buses 29, as seen in FIGS. 5 and 8. The side rail buses 26 have respective silver, copper and solder layers 33, 35 and 37 which are of the same thicknesses as these three respective layers of the main bus 29 (FIG.5).

The region 42 has a resistivity in the range of 0.01 to 0.5 ohm centimeters and preferably has a resistivity of 0.05 ohm centimeters. The region 50 has a resistivity in the range of 0.15 to 1.0 ohm centimeters and preferably has a resistivity in this range and less than 0.5 ohm centimeters.

The regions 49 and 51 (FIG. 1) are each shown in an n+—p—p+ type configuration, but the cell 20 would also be operable with these regions each in p+—n—n+ type configuration. This latter configuration is obtained by interchanging the locations of the phosphorous-containing dopant and boron-containing dopant in FIG. 11.

In forming the cell 20, the laminate 100 (FIG. 10), after rinsing and after passing the guide roller 158, is edge trimmed by laser beams to a width of 10 centimeters. FIG. 8 shows the edge region of the edge-trimmed laminate substrate.

The front contact members 27 in the chevron pattern are spaced 151 microns on centers, and as shown in FIG. 4, extend at an angle of 60° to the intermediate buses 28. The rear contact members 25 (FIG. 1) have a width of approximately 6 microns and a thickness of approximately 12 microns, comprising the layer of silver 33 which is approximately 2 microns thick and the layer of copper 35 which is approximately 10 microns thick. The rear contact members 25 are in a chevron pattern and are also spaced 151 microns on centers. Electrical connection with the rear contact members 25 is made by placing their copper layers 35 against a conductive mount (not shown).

The intermediate bus bars 28 are spaced 0.5 centimeters on centers. The main bus bars 29 are spaced 1.0 centimeters on centers, and they connect at their respective ends with both of the side rail buses 26. These side rail buses 26 extend along opposite edges of the cell 20 which is trimmed to a width of 10 centimeters, as described above, and thus these side rail buses 26 are spaced apart slightly less than 10 centimeters. The cell 20 is a continuous ribbon and can be cut to any desired length for forming an individual photovoltaic cell for a particular application. Electrical connection with the front 21 of the cell 20 is made by a plurality of conductive clamps (not shown) which clamp onto the side rail buses 26 at spaced points along the length of these side rail buses in regions where the ARC layer assembly 39 (FIG. 8) has been removed from these side rail buses.

The ceramic metallic glass semi-conductor alloy compositions of the front region 49 and rear region 51 of the cell 20 enable the respective spectral sensitivities, i.e., the respective band gaps, of these two regions to be individually tailored to the desired frequency ranges of the incident light rays for optimizing the collection efficiency of the cell 20. The preferred band gap for the front cell region 49 is in the range from 1.55 to 1.65 electron volts, and the preferred band gap for the rear cell region 51 is in the range from 0.9 to 1.1 electron volts with these two cell regions operating in series electrically as shown in FIG. 1.

The metalization on the front 21 of the cell provided by the contact members 27 and the intermediate and main buses 28, 29 and the side rail buses 26 enable this cell 20 to be operated at a solar radiation concentration intensity up to 250 suns.

It is to be noted that the metalization on the front 21 including contact members 27, intermediate bus bars 28 and main bus bars 29 is a three-level metalization. When the incident radiation is arriving perpendicular to the front face 21, the shadowing caused by this metalization is less than 5%. In other words, with perpendicular incident light rays the active, unshadowed area of this cell is advantageously more than 95%.

With respect to the light transparent semi-vitreous glass ARC layer 31, the compositions of this layer 31 may include a flux for lowering its melting temperature. Said flux is in an amount less than 20% by weight of the total composition and includes a fluxing compound selected from the group consisting of tin dioxide, antimony dioxide and antimony trioxide. The balance of said total composition of layer 31 is trace elements in an amount less than 2% by weight of the total.

As described above, in the rolling chambers 117, 118, 119 and in the rolling chambers 217, 218, 219 and in the laminating chambers 124, 125, the ceramic metallic glass semi-conductive silicon alloy ribbons 49, 51 and the laminate 100 are preferably heated to be at a level of approximately 20° C. to 60° C. below their semi-liquidus condition. Said alloy advantageously melts in the range of approximately 800° C. to 1,150° C. Thus, the preferred temperature of the silicon alloy in said chambers is in the range from 740° C. to 1,130° C.

I claim:

1. In a photovoltaic cell an anti-reflective coating (ARC) covering the front surface of the cell adapted to receive incident radiation, the improvement comprising said ARC coating comprising upper and lower layers bonded together by an intervening layer being formed from a semi-vitreous glass alloy composition comprising: about 67 to about 82 percent silicon dioxide, about 5 to about 14 percent aluminum trioxide, about 6 to 18 percent boron trioxide, about 4 to about 20 percent sodium oxide and about 0.01 to about 5 percent phosphorous pentoxide, wherein the percentages are expressed as percents by weight based upon the total weight of the alloy composition.

2. In a photovoltaic cell, an intervening layer as defined in claim 1, wherein said intervening layer is bonded to the surface of an underlying layer by heating said intervening layer to a temperature of from about 750° C. to a temperature of less than about 850° C.

3. In a photovoltaic cell, an intervening layer as defined in claim 1 or 2, wherein said intervening layer has a thickness in the range from about 50 Angstroms to about 400 Angstroms.

4. In a photovoltaic cell, an intervening layer as defined in claim 1 or 2, wherein the ratio by weight of silicon dioxide to aluminum trioxide is in the range from 16.4 to 1 to 4.8 to 1.

5. In a photovoltaic cell, an intervening layer as defined in claim 1 or 2, including a flux in an amount less than about 20 percent by weight of the total composition, said flux being a compound selected from the group of compounds consisting of tin dioxide, antimony dioxide and antimony trioxide, and wherein the balance of said total composition is trace elements in an amount less than about 2 percent by weight of the total composition.

6. In a photovoltaic cell, an intervening layer having semi-vitreous glass alloy composition as defined in claim 1 or 2, including about 73 percent silicon dioxide, about 7 percent aluminum trioxide, about 10 percent boron trioxide, about 8.7 percent sodium oxide and about 1.3 percent phosphorous pentoxide.

7. In a photovoltaic cell, an intervening layer having semi-vitrous glass alloy composition as defined in claim 1 or 2, including about 68 percent silicon dioxide, about 5 percent aluminum trioxide, about 15 percent boron trioxide, about 11.2 percent sodium oxide and about 9.8 percent phosphorous pentoxide.

8. In a photovoltaic cell having a silicon-containing semiconductor body in which the silicon comprises more than 50% by weight of the semiconductor body and wherein silver contact members are used to collect the charge carriers from the semiconductor body, strike barriers positioned between said semiconductor body and said contact members, each such strike barrier having a width at least as wide as the associated contact member and comprising a layer formed of titanium nitride and cobalt nitride containing at least 90% titanium nitride and at least 1% cobalt nitride by weight percent of the total composition of the strike barrier layer for preventing migration of silver atoms from the contact members into the semiconductor body and for reducing the contact resistance of the silver contact members with respect to the semiconductor body.

9. In a photovoltaic cell, strike barriers as defined in claim 8, having a thickness of approximately 100 Angstroms.

10. A photovoltaic cell having a first plurality of elongated, spaced parallel contact members on the front thereof and a second plurality of elongated, spaced, parallel contact members on the rear thereof, said contact members of the first plurality being in a first chevron pattern, said contact members of the second plurality on the rear of the cell being in a second chevron pattern of the same configuration as the first chevron pattern and reversed with respect to the first pattern for minimizing likelihood of short circuit between front and rear contact member, said rear of the cell being optically reflective and having an undulating configuration between each of the rear contact members for reflecting light rays within the cell along various paths with respect to the respective chevron patterns.

11. A photovoltaic cell having at least one photoactive region formed of a ceramic metallic glass semi-conductor alloy of silicon characterized by the indicated weight percent of the following elements:

| Ingredient | Range in Weight Percent of Total Composition |
|---|---|
| Silicon | 51-88% |
| Lithium | 3-30% |
| Aluminum | 0.5-29% |
| Fluorine | 0.5-8% |
| Hydrogen | 1-12% |
| Vanadium | 0-5% |
| Trace Elements, Including Oxygen | Less than 0.1% |

12. A photovoltaic cell having at least one photoactive region formed of a ceramic metallic glass semi-conductor alloy of silicon characterized by the indicated weight percent of the following elements:

| Ingredient | Range in Weight Percent of Total Composition |
|---|---|
| Silicon | 51-88% |
| Lithium | 3-30% |
| Aluminum | 0.5-29% |
| Fluorine | 0.5-8% |
| Hydrogen | 0.5-12% |
| Antimony | 0.01-20% |
| Cobalt | 0.01-6% |
| Trace Elements, Including Oxygen | Less than 0.1% |

13. In a photovoltaic cell having a photoactive region, internally reflective rear mirror means applied to said photoactive region comprising a layer of tin, a layer of chromium applied to said tin layer and being located behind said tin layer, said tin layer preventing migration of chromium atoms into said photoactive region.

14. In a photovoltaic cell, internally reflective rear mirror means as claimed in claim 13, in which:
said tin layer is at least 50 Angstroms thick.

15. In a photovoltaic cell, internally reflective rear mirror means as claimed in claim 13, in which:
said photoactive region has a multiplicity of interdigitated n+ and p+ stripes alternating in position immediately adjacent one to another, said n+ and p+ stripes being adjacent to said tin layer.

16. In a photovoltaic cell having a photosensitive region, charge carrier collection means on the rear of said region comprising a plurality of interdigitated p+ and n+ doped stripes alternating in position and each having a thickness in the range from 0.5 to 1.5 microns, said interdigitated stripes being immediately adjacent one to another.

17. In a photovoltaic cell, charge carrier collection means as defined in claim 16, in which:
a first plurality of said immediately adjacent interdigitated p+ and n+ stripes are located on a first sloping rear surface of said photosensitive region, and
a second plurality of said immediately adjacent interdigitated p+ and n+ stripes are located on a second sloping rear surface of said photosensitive region which slopes in the opposite direction from said first sloping rear surface.

18. In a photovoltaic cell, charge carrier collection means as defined in claim 17, in which:
a first internally reflective mirror is positioned adjacent to and slopes at the same angle as said first plurality of interdigitated stripes, and
a second internally reflective mirror is positioned adjacent to and slopes at the same angle as said second plurality of interdigitated stripes.

19. In a photovoltaic cell having a photosensitive region with a front surface and having contact members extending in front of said front surface, combined spectral filter and passivating means comprising:
a spectral filter layer on the front surface of said photosensitive region, said spectral filter layer extending continuously across said front surface and extending beneath said contact members and consisting mainly of cobalt nitride together with tin oxide having a bright green-to-blue color, said spectral filter layer also acting as a passivating layer on the front surface of said photosensitive region.

20. In a photovoltaic cell, a spectral filter layer as defined in claim 19, in which:
said spectral filter layer contains cobalt nitride and tin oxide in a weight ratio of about 58% to 42%.

21. In a photovoltaic cell, a spectral filter layer as claimed in claim 19, in which:
said green-to-blue colored filter excludes wavelengths longer than approximately 12,000 Angstroms.

22. A multiple junction photovoltaic cell comprising a front and a rear cell, said cells being formed of ceramic metallic glass alloys of silicon having different band gaps and being positioned one in front of the other with a thin optically transparent lattice matching layer optically and electrically coupling them in series, and with electrical contact members on the front of the front cell and on the rear of the rear cell for operating the two cells in series.

23. A multiple junction photovoltaic cell as claimed in claim 22, in which:
one of said cells has a band gap in the range of 1.55 to 1.65 electron volts and the other has a band gap in the range from 0.9 to 1.1 electron volts.

24. A multiple junction photovoltaic cell as claimed in claim 22, in which:
one of said cells has a glassy silicon alloy composition characterized by the following weight percent of the following elements:

| Ingredient | Range in Weight Percent of Total Composition |
|---|---|
| Silicon | 51–88% |
| Lithium | 3–30% |
| Aluminum | 0.5–29% |
| Fluorine | 0.5–8% |
| Hydrogen | 1–12% |
| Vanadium | 0–5% |
| Trace Elements, Including Oxygen | Less than 0.1% |

25. A multiple junction photovoltaic cell as claimed in claim 22, in which:
one of said cells has a glassy silicon alloy composition characterized by the following weight percent of the following elements:

| Inqredient | Range in Weight of Total Composition |
|---|---|
| Silicon | 51–88% |
| Lithium | 3–30% |
| Aluminum | 0.5–29% |
| Fluorine | 0.5–8% |
| Hydrogen | 0.5–12% |
| Antimony | 0.01–20% |
| Cobalt | 0.01–6% |
| Trace Elements, Including Oxygen | Less than 0.1% |

26. A multiple junction photovoltaic cell as claimed in claim 22, in which:
the band gap of the glassy silicon alloy in the front cell is higher than the band gap of the glassy silicon alloy in the rear cell.

27. A multi-junction cell comprising: front and rear juction regions positioned in tandem one in front of the other, each of said junction regions being formed of a glassy silicon alloy, the spectral sensivity of the rear junction region being different from the spectral sensitivity of the front junction region said front and rear junction regions being optically and electrically coupled together in series by an intervening thin, optically transparent lattice matching layer, first electrical contact means associated with the front of the cell and second electrical contact means associated with the rear of the cell for operating the two junction regions in series.

28. A multi-junction cell as claimed in claim 27, having back surface reflector means for internally reflecting light rays forwardly, and having over the front of said cell a semi-conductive one-way window layer transparent to incoming light rays but acting as an optical mirror for internally reflecting light rays rearwardly which have previously been reflected forwardly from the back for preventing escape of these internal light rays.

29. A multi-junction cell as claimed in claim 28, having a non-planar rear surface configuration including a plurality of sloping reflecting regions in said back surface reflector means for internally reflecting light rays along various paths.

30. A multi-junction cell as claimed in claim 29, in which:
said sloping regions slope at an angle in the range from approximately 10° to 15° to the plane of the cell.

31. A multi-junction cell as claimed in claim 27, having a green-to-blue spectral filter in front of the front junction region for excluding wavelengths longer than the middle of the near infra-red range at approximately 12,000 Angstroms for keeping the cell operating relatively cool and also for excluding ultra violet radiation shorter than about 4,000 Angstroms for preventing ultraviolet degradation.

32. A multi-junction cell as claimed in claim 27, in which:
the front junction region includes a highly doped zone immediately adjacent to the front of said intervening matching layer, and
the rear junction region includes a highly doped zone of opposite polarity type immediately adjacent to the rear of said intervening matching layer.

33. A photovoltaic cell including a contact structure comprising:
a plurality of elongated contact members formed of silver positioned on the cell for providing electrical connection with the cell,
a plurality of intermediate buses connected to said silver contact members,
said intermediate buses including lower portions formed of silver integral with said contact members and formed at the same time as said silver contact members, and
said intermediate buses each including an upper portion of larger cross-sectional area than said lower portion, and
said upper portion being formed of copper and being positioned directly on top of and contiguous with said lower silver portion.

34. A photovoltaic cell including contact structure as claimed in claim 33, in which:
a plurality of main buses are connected to said intermediate buses,
said main buses include first, second and third portions,
said second portion has a larger cross-sectional area than said first portion and is positioned directly on top of said first portion and is contiguous therewith,
said third portion has a larger cross-sectional area than said second portion and is positioned directly on top of said second portion and is contiguous therewith,
said first portion is formed of silver integral with said silver lower portion of each intermediate bus and is formed at the same time as said lower portion,
said second portion is formed of copper integral with said copper upper portion of each intermediate bus and is formed at the same time as said upper portion, and
said third portion is formed of solder.

35. A photovoltaic cell including a contact structure as claimed in claim 34, in which:
   said second portion of each main bus has a copper thickness equal to the thickness of the upper copper portion of each intermediate bus, and
   said third portion of each main bus has a solder thickness many times greater than the thickness of the second portion.

36. A photovoltaic cell including a contact structure as claimed in claim 33, in which:
   said upper copper portion of each intermediate bus has a vertical thickness many times greater than the thickness of the lower silver portion.

37. A photovoltaic cell including a contact structure as claimed in claim 33, in which:
   said elongated contact members extend at an angle approximately 60° to said intermediate buses.

38. In a photovoltaic cell having a photoresponsive region, charge carrier collection means on the rear of said region comprising a plurality of interdigitated p+ and n+ doped stripes alternating in position, said interdigitated stripes being immediately adjacent one another, and an electrically conductive metal layer immediately adjacent to the rear of said interdigitated stripes, said stripes having a width in the direction parallel to said metal layer greater than their thickness in the direction perpendicular to said metal layer.

* * * * *